(12) United States Patent
Ko et al.

(10) Patent No.: US 11,355,467 B2
(45) Date of Patent: Jun. 7, 2022

(54) SEMICONDUCTOR DEVICES INCLUDING THICK PAD

(71) Applicant: Samsung Electronics Co., Ltd., Suwon-si (KR)

(72) Inventors: Taeho Ko, Cheonan-si (KR); Daehee Lee, Cheonan-si (KR); Hyunchul Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/983,296

(22) Filed: Aug. 3, 2020

(65) Prior Publication Data

US 2021/0217720 A1 Jul. 15, 2021

(30) Foreign Application Priority Data

Jan. 15, 2020 (KR) .................. 10-2020-0005173

(51) Int. Cl.
*H01L 23/31* (2006.01)
*H01L 23/00* (2006.01)

(52) U.S. Cl.
CPC .......... *H01L 24/24* (2013.01); *H01L 23/3128* (2013.01); *H01L 24/05* (2013.01); *H01L 24/13* (2013.01); *H01L 24/82* (2013.01); *H01L 2224/03462* (2013.01); *H01L 2224/03903* (2013.01); *H01L 2224/0401* (2013.01); *H01L 2224/05006* (2013.01); *H01L 2224/05552* (2013.01); *H01L 2224/05553* (2013.01); *H01L 2224/05556* (2013.01); *H01L 2224/05564* (2013.01); *H01L 2224/05573* (2013.01); *H01L 2224/05582* (2013.01); *H01L 2224/05647* (2013.01); *H01L 2224/13006* (2013.01); *H01L 2224/245* (2013.01); *H01L 2224/24101* (2013.01); *H01L 2224/24155* (2013.01); *H01L 2224/82101* (2013.01); *H01L 2224/82106* (2013.01)

(58) Field of Classification Search
CPC ...................................................... H01L 24/24
See application file for complete search history.

(56) References Cited

U.S. PATENT DOCUMENTS 9,484,291 B1 * 11/2016 Dhandapani ............ H01L 24/10
2002/0093096 A1 7/2002 Tago et al.
(Continued)

FOREIGN PATENT DOCUMENTS

JP  2005-216939 A  8/2005
JP  4313520 B2  8/2009
(Continued)

*Primary Examiner* — William A Harriston
(74) *Attorney, Agent, or Firm* — Harness, Dickey & Pierce, P.L.C.

(57) ABSTRACT

A semiconductor device may include a semiconductor chip in an encapsulant. A first insulation layer may be disposed on the encapsulant and the semiconductor chip. A horizontal wiring and a primary pad may be disposed on the first insulation layer. A secondary pad may be disposed on the primary pad. A second insulation layer covering the horizontal wiring may be disposed on the first insulation layer. A solder ball may be disposed on the primary pad and the secondary pad. The primary pad may have substantially the same thickness as a thickness of the horizontal wiring.

20 Claims, 13 Drawing Sheets

(56) References Cited

U.S. PATENT DOCUMENTS

| | | |
|---|---|---|
| 2005/0279812 A1 | 12/2005 | Tago et al. |
| 2007/0295786 A1 | 12/2007 | Tago et al. |
| 2008/0088018 A1* | 4/2008 | Yoon .................. H01L 23/3128 257/738 |
| 2010/0015796 A1 | 1/2010 | Tago et al. |
| 2011/0101523 A1 | 5/2011 | Hwang et al. |
| 2011/0101527 A1 | 5/2011 | Cheng et al. |
| 2011/0151645 A1 | 6/2011 | Miki |
| 2011/0260339 A1 | 10/2011 | Miki |
| 2015/0162296 A1 | 6/2015 | Risaki et al. |
| 2016/0133601 A1 | 5/2016 | Ko et al. |
| 2018/0294243 A1 | 10/2018 | Risaki et al. |
| 2019/0287930 A1 | 9/2019 | Tsuchida |

FOREIGN PATENT DOCUMENTS

| | | |
|---|---|---|
| JP | 4444560 B2 | 3/2010 |
| JP | 5563814 B2 | 7/2014 |
| KR | 10-0541377 B1 | 1/2006 |
| KR | 10-1055545 B1 | 8/2011 |
| KR | 10-1208758 B1 | 12/2012 |
| KR | 10-2013-0065478 A | 6/2013 |
| KR | 10-1640076 B1 | 7/2016 |
| KR | 10-2019-0093612 A | 8/2019 |
| KR | 10-2010224 B1 | 8/2019 |

\* cited by examiner

SEMICONDUCTOR DEVICES INCLUDING THICK PAD

CROSS-REFERENCE TO THE RELATED APPLICATION

This U.S. non-provisional patent application claims priority from Korean Patent Application No. 10-2020-0005173, filed on Jan. 15, 2020, in the Korean Intellectual Property Office (KIPO), the disclosure of which is incorporated herein by reference in its entirety.

BACKGROUND

1. Field

Apparatuses and methods consistent with example embodiments of the inventive concepts relate to semiconductor devices and a method of manufacturing the same.

2. Description of the Related Art

Semiconductor devices may each include a plurality of pads. A plurality of solder balls may be formed on the plurality of pads. An electrical connection between the plurality of solder balls and the plurality of pads largely affects an electrical characteristic of the semiconductor devices. Various factors can affect the electrical connection between the solder balls and the pads. Various research for enhancing the physical and/or electrical reliability of the electrical connection is being done by employing a connection structure between the plurality of solder balls and the plurality of pads.

SUMMARY

The example embodiments are directed to a semiconductor device having a good electrical characteristic and/or high reliability, and a method of manufacturing the semiconductor device, in which a manufacturing process is simplified.

A semiconductor device according to some example embodiments may include a semiconductor chip in an encapsulant. A first insulation layer may be on the encapsulant and the semiconductor chip. A horizontal wiring and a primary pad may be on the first insulation layer, and a thickness of the primary pad may be substantially the same as a thickness of the horizontal wiring. A secondary pad may be on the primary pad. A second insulation layer may be on the first insulation layer; the second insulation layer may be covering the horizontal wiring. A solder ball may be on the primary pad and the secondary pad.

A semiconductor device according to some example embodiments may include a semiconductor chip in a package substrate. A first insulation layer may be disposed on the package substrate and the semiconductor chip. A horizontal wiring and a primary pad may be disposed on the first insulation layer; and a thickness of the primary pad may be substantially the same as a thickness of the horizontal wiring. A secondary pad may be disposed on the primary pad. A second insulation layer covering the horizontal wiring may be disposed on the first insulation layer. A solder ball may be disposed on the primary pad and the secondary pad.

A semiconductor device according to some example embodiments may include a stack of semiconductor packages, the stacking including a plurality of semiconductor packages stacked. Each of the plurality of semiconductor packages may include a semiconductor chip in a package substrate. A first insulation layer may be disposed on the package substrate and the semiconductor chip. A horizontal wiring and a primary pad may be disposed on the first insulation layer; a thickness of the primary pad may be substantially the same as a thickness of the horizontal wiring. A secondary pad may be disposed on the primary pad. A second insulation layer covering the horizontal wiring may be disposed on the first insulation layer. A solder ball may be disposed on the primary pad and the secondary pad.

DETAILED DESCRIPTION OF EXAMPLE EMBODIMENTS

Figure 1:
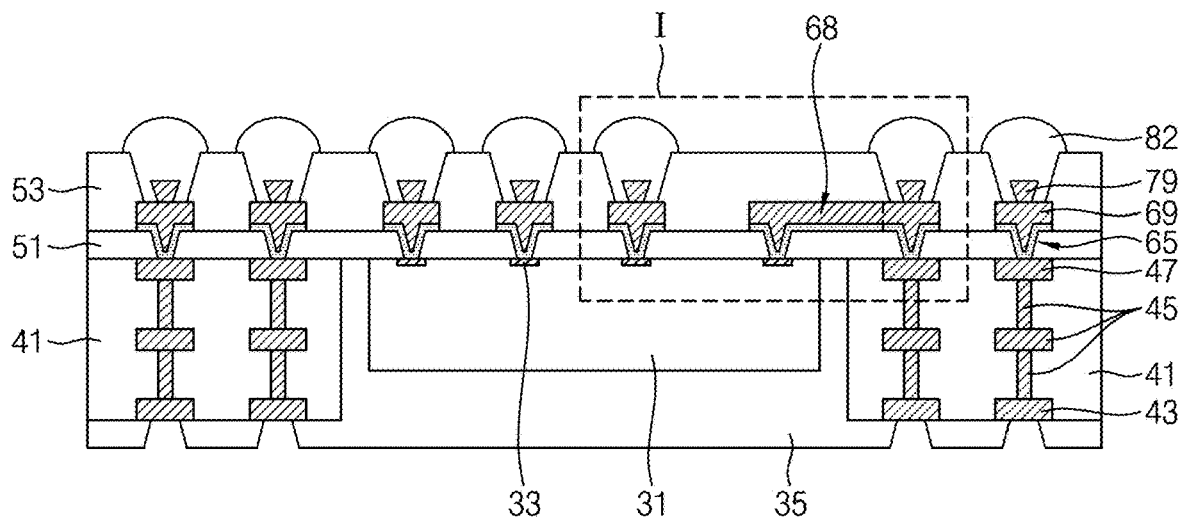
FIG. 1 is a cross-sectional view for describing a semiconductor device according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the following description, when a constituent element is disposed "above" or "on" to another constituent element, the constituent element may be only directly on the other constituent element or above the other constituent elements in a non-contact manner An expression used in a singular form in the specification also includes the expression in its plural form unless clearly specified otherwise in context. It will be further understood that the terms "comprises" and/or "comprising" used herein specify the presence of stated features or components, but do not preclude the presence or addition of one or more other features or components.

Spatially relative terms, such as "above," "below," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2:
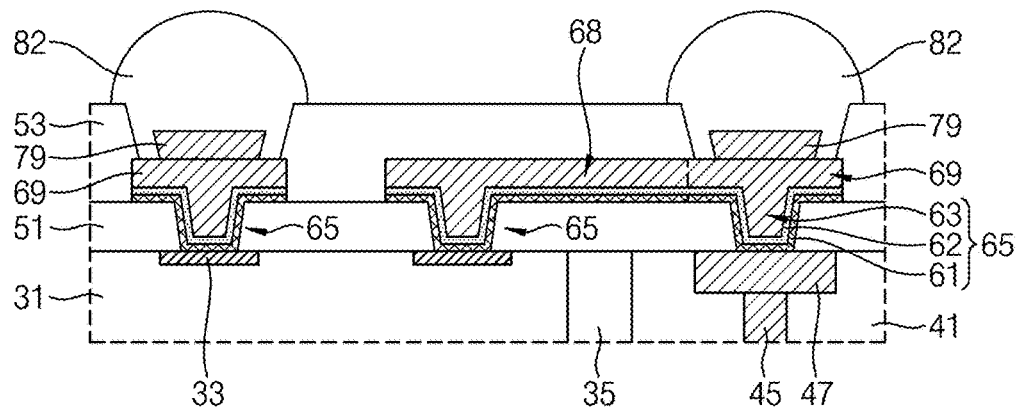
FIGS. 2 to 4 and 11 to 17 are enlarged views illustrating a portion of FIG. 1.
Figure 3:
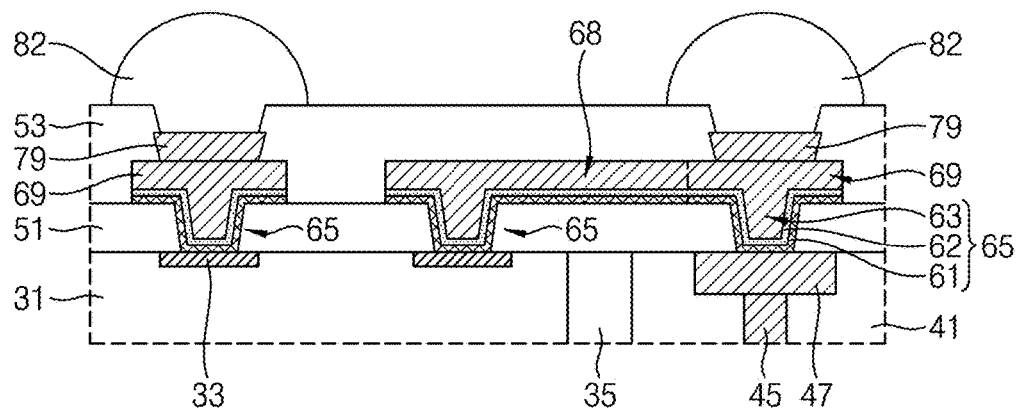
Figure 4:
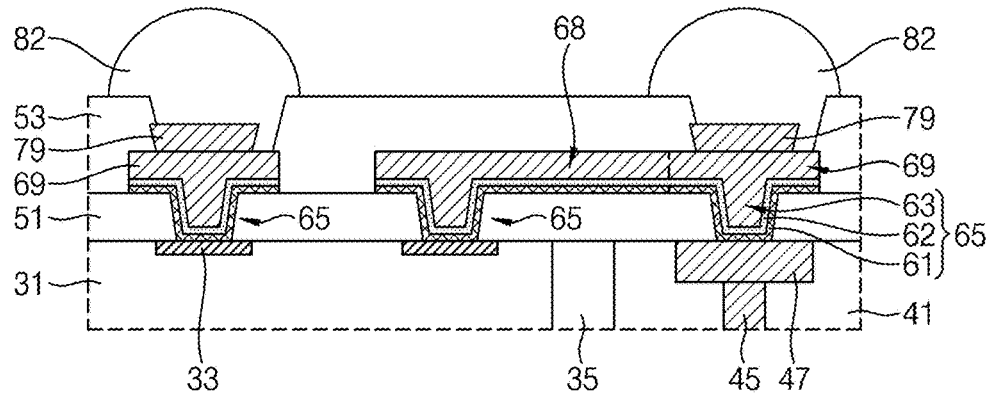

FIG. 1 is a cross-sectional view for describing a semiconductor device according to some example embodiments. FIGS. 2 to 4 are enlarged views illustrating a portion I of FIG. 1; FIGS. 5 to 10 are layouts illustrating some elements of FIG. 1, and FIGS. 11 to 17 are enlarged views illustrating the portion I of FIG. 1. The semiconductor devices according to an example embodiment may include a panel level package (PLP) or a wafer level package (WLP).

Referring to FIG. 1, the semiconductor device may include a semiconductor chip 31, an encapsulant 35, a package substrate 41, a first insulation layer 51, a second insulation layer 53, a plurality of contact plugs 65, a horizontal wiring 68, a plurality of primary pads 69, a plurality of secondary pads 79, and a plurality of solder balls 82. The semiconductor chip 31 may include a plurality of chip pads 33. The package substrate 41 may include a plurality of internal wirings 45, a plurality of bottom connection terminals 43, and a plurality of top connection terminals 47. Though the plurality of internal wirings 45 are illustrated as arranged linearly perpendicular to an upper surface of the package substrate, the example embodiment is not so limited, and may, for example, one or more redistribution patterns connecting the top connection terminals 47 and the bottom connection terminals 43. The redistribution pattern may stagger the internal wirings 45, to allow different spacing between the top connection terminals 47 when compared to the bottom connection terminals 43.

In an example embodiment, the plurality of contact plugs 65, the horizontal wiring 68, and the plurality of primary pads 69 may correspond to a redistribution layer (RDL). Referring to FIG. 2, each of the plurality of contact plugs 65 may include a first barrier layer 61, a first seed layer 62, and a conductive core 63. In some example embodiments, the first barrier layer 61 may be omitted. The first seed layer 62 may have a lattice parameter equal to or between the lattice parameters of the conductive core 63 layer and the layer directly beneath the seed layer; and/or the seed layer may be thin enough to prevent and/or mitigate the lattice strain due to lattice mismatch between the materials of the conductive core 63 and other layer. For example, the first seed layer 62 may have a lattice parameter between the lattice parameters of the conductive core 63 and the first barrier layer 61, or, in the case wherein the first barrier layer is omitted, the first seed layer 62 may have a lattice parameter between the lattice parameters of the conductive core 63 and the top connection terminals 47. The first seed layer 62 may, therefore, also promote adhesion between the conductive core 63 and the layer directly under the first seed layer 62, thus preventing the decohesion of the conductive core 63 due to lattice mismatch. The first seed layer 62 may help promote the nucleation of seed crystals during the deposition of the conductive core 63. The conductive core 63 may be formed from the already-nucleated seeds increasing in size and/or from the formation of new nucleated seeds.

Referring again to FIGS. 1 and 2, the semiconductor chip 31 may be disposed on the package substrate 41. The encapsulant 35 may be disposed between the package substrate 41 and the semiconductor chip 31. The encapsulant 35 may surround a bottom surface of side surfaces of the semiconductor chip 31. The encapsulant 35 may extend to a bottom surface of the package substrate 41. An edge of each of the plurality of bottom connection terminals 43 may be covered by the encapsulant 35. A center portion of each of the plurality of bottom connection terminals 43 may be exposed. The plurality of top connection terminals 47 may be electrically connected to the plurality of bottom connection terminals 43 via the plurality of internal wirings 45, respectively.

Top surfaces of the package substrate 41, the plurality of top connection terminals 47, the encapsulant 35, and the semiconductor chip 31 may be substantially coplanar. The first insulation layer 51 may be on the package substrate 41, the encapsulant 35, and the semiconductor chip 31. The plurality of contact plugs 65 may be in the first insulation layer 51. The horizontal wiring 68 and the plurality of primary pads 69 may be on the first insulation layer 51.

The plurality of contact plugs 65 may extend from an upper surface of the first insulation layer 51 to an inner portion of the first insulation layer 51. Some of the plurality of contact plugs 65 may pass through the first insulation layer 51 and may contact the plurality of top connection terminals 47. Some of the plurality of contact plugs 65 may be electrically connected to the plurality of top connection terminals 47. Some of the plurality of contact plugs 65 may pass through the first insulation layer 51 and may contact the plurality of chip pads 33. Some of the plurality of contact plugs 65 may be electrically connected to the plurality of chip pads 33. Some of the plurality of contact plugs 65 may be electrically connected to both a chip pad 33 and a top connection terminal 47.

The first seed layer 62 may surround a side surface and a bottom of the conductive core 63. The first barrier layer 61 may surround an outer portion and a bottom of the first seed layer 62. The horizontal wiring 68 may overlap an upper portion of both the semiconductor chip 31 and the package substrate 41. The horizontal wiring 68 may be on the plurality of contact plugs 65, and may electrically connect two or more of the contact plugs 65. The horizontal wiring 68 may partially overlap an upper portion of at least one contact plug 65 selected from among the plurality of contact plugs 65. The horizontal wiring 68 may be in continuity with a primary pad 69 and/or an upper portion of the conductive core 63. The first barrier layer 61 may extend to a portion between the horizontal wiring 68 and the first insulation layer 51. The first seed layer 62 may extend to a portion between the horizontal wiring 68 and the first insulation layer 51.

The plurality of primary pads 69 may be on the plurality of contact plugs 65. The plurality of primary pads 69 may partially overlap the plurality of contact plugs 65. Each of the plurality of primary pads 69 may be in continuity with an upper portion of the conductive core 63. The first barrier layer 61 may extend to a portion between the plurality of primary pads 69 and the first insulation layer 51. The first seed layer 62 may extend to a portion between the plurality of primary pads 69 and the first barrier layer 61. In an embodiment, the first barrier layer 61 may be between the first seed layer 62 and the first insulation layer 51, between the first seed layer 62 and the plurality of top connection terminals 47, and between the first seed layer 62 and the plurality of chip pads 33.

At least one of the plurality of primary pads 69 may be in continuity with a side surface of the horizontal wiring 68. The plurality of primary pads 69, the horizontal wiring 68, and the conductive core 63 may have been formed simultaneously, and, therefore, may include the same material layer. The plurality of primary pads 69, the horizontal wiring 68, and the conductive core 63 may include a conductive material layer, for example, a copper (Cu) layer formed by an electroplating process. Each of the plurality of primary pads 69 may have substantially the same thickness (e.g., as measured in a direction perpendicular to the upper surface of the primary pads 69) as that of the horizontal wiring 68. For example, a side surface of each of the plurality of primary pads 69 may have substantially the same profile as the side surface of the horizontal wiring 68.

The plurality of secondary pads 79 may be on the plurality of primary pads 69. The plurality of secondary pads 79 may include the same material as that of each of the plurality of primary pads 69. The plurality of primary pads 69 and the plurality of secondary pads 79 may include the same conductive material. For example, the plurality of primary pads 69 and the plurality of secondary pads may both include a Cu layer. In an embodiment, the plurality of primary pads 69 may be between the first seed layer 62 and the plurality of secondary pads 79.

Each of the plurality of secondary pads 79 may include various shapes. Each of the plurality of secondary pads 79 may include an inverted trapezoidal shape having a width which increases in a direction distancing from the plurality of primary pads 69. For example, the plurality of secondary pads 79 may have a narrow width at the surface in contact with the plurality of primary pads 69 when compared to opposite, upper surface. Each of the plurality of secondary pads 79 may have a narrower width than that of one primary pad adjacent thereto among the plurality of primary pads 69. For example, each of the plurality of secondary pads 79 may sit completely within an area defined by the upper surface of the one primary pad of the plurality of primary pads 69 upon which the secondary pad 79 sits. Each of the plurality of secondary pads 79 may directly contact a top surface of one primary pad adjacent thereto among the plurality of primary pads 69. Each of the plurality of secondary pads 79 may be aligned at a center of one primary pad adjacent thereto among the plurality of primary pads 69.

The second insulation layer 53 may be on the first insulation layer 51. The second insulation layer 53 may cover the horizontal wiring 68, the side surfaces of the plurality of primary pads 69, and an edge of a top surface of each of the plurality of primary pads 69.

The plurality of solder balls 82 may be disposed on the plurality of primary pads 69 and the plurality of secondary pads 79. The plurality of solder balls may include a solder, for example, a SnAgCu (SAC) solder. The solder may include a conductive eutectic alloy with a melting temperature below the melting temperature of the conductive material included in the plurality of secondary pads 79 and primary pads 69 and/or the degradation temperature of the second insulation layer 53. The plurality of solder balls 82 may extend from an upper surface of the second insulation layer 53 to an inner portion of the second insulation layer 53. The plurality of solder balls 82 may extend to a level higher than a top surface of the second insulation layer 53. The plurality of solder balls 82 may pass through the second insulation layer 53 to contact top surfaces and side surfaces of the plurality of secondary pads 79 and top surfaces of the plurality of primary pads 69.

Referring to FIG. 3, the second insulation layer 53 may cover the horizontal wiring 68, cover the side surfaces of the plurality of primary pads 69, cover the top surfaces of the plurality of primary pads 69, cover side surfaces of the plurality of secondary pads 79, and cover edges of the plurality of secondary pads 79. In this example embodiment, the plurality of solder balls 82 may pass through the second insulation layer 53 to contact the top surfaces of the plurality of secondary pads 79.

Referring to FIG. 4, the second insulation layer 53 may cover the horizontal wiring 68, cover the side surfaces of the plurality of primary pads 69, partially cover the top surfaces of the plurality of primary pads 69, partially cover the side surfaces of the plurality of secondary pads 79, and partially cover the edges of the plurality of secondary pads 79. The plurality of solder balls 82 may pass through the second insulation layer 53 to partially contact the top surfaces and the side surfaces of the plurality of secondary pads 79 and the top surfaces of the plurality of primary pads 69.

Figure 5:
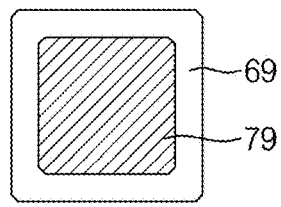
FIGS. 5 to 10 are layouts illustrating some elements of FIG. 1.

Referring to FIG. 5, the secondary pad 79 may overlap the primary pad 69. The secondary pad 79 may have a width which is narrower than that of the primary pad 69. The secondary pad 79 may be disposed adjacent to a center of the primary pad 69. The secondary pad 79 may include a polygonal and/or a circular shape when viewed in a plan view. For example, the secondary pad 79 may include a circle, an oval, an ellipse, a quadrangle with round corners, a quadrangle, a pentagonal, and/or the like.

Figure 6:
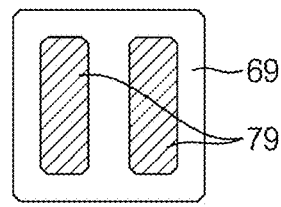

Referring to FIG. 6, the secondary pad 79 may include a bar shape. The secondary pad 79 may include, for example, a combination of bar shapes and a space and/or a single bar (not illustrated).

Figure 7:
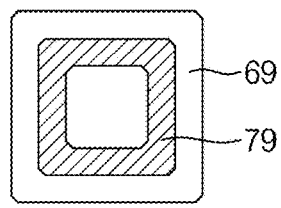

Referring to FIG. 7, the secondary pad 79 may include a ring, for example, a circular ring shape, a tetragonal ring shape, a polygonal ring shape, or a combination thereof.

Figure 8:
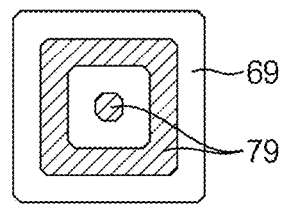

Referring to FIG. 8, the secondary pad 79 may include a combination of a ring shape and a target shape.

Figure 9:
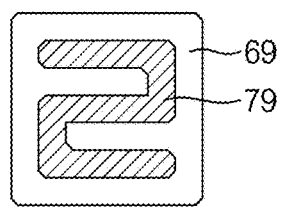

Referring to FIG. 9, the secondary pad 79 may include a combination of bar shapes, ring shapes, and space. The combination of the bar shapes, ring shapes, and/or space to form a single shape with a pattern, for example a zigzag, may be referred to as an embossing shape. The combination of the bar shapes, ring shapes, and/or space to form a single shape without a pattern may be referred to as an amoebic shape (not illustrated). The secondary pad 79 may include, for example, a zigzag shape and/or an amoebic shape. For example, the secondary pad 79 may include a region with an embossed shape and a region with an amoebic shape.

Figure 10:
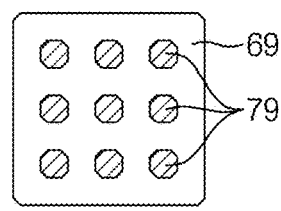

Referring to FIG. 10, the secondary pad 79 may include a plurality of pillar shapes, a plurality of embossing shapes, or a combination thereof.

Figure 11:
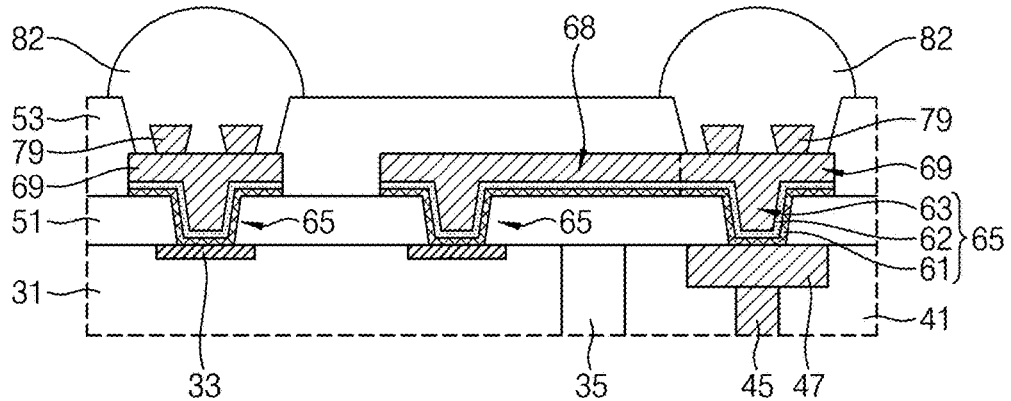

Referring to FIG. 11, each of the plurality of secondary pads 79 may include a plurality of pillar shapes when viewed in a cross-sectional view.

Figure 12:
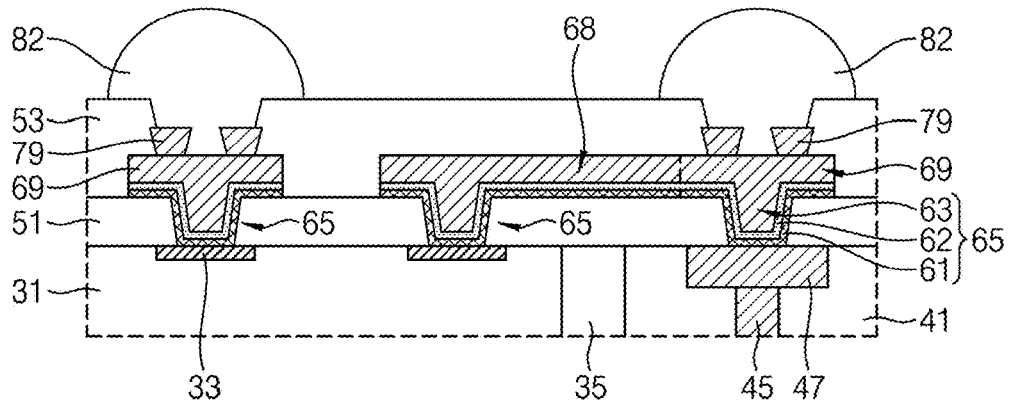
Figure 13:
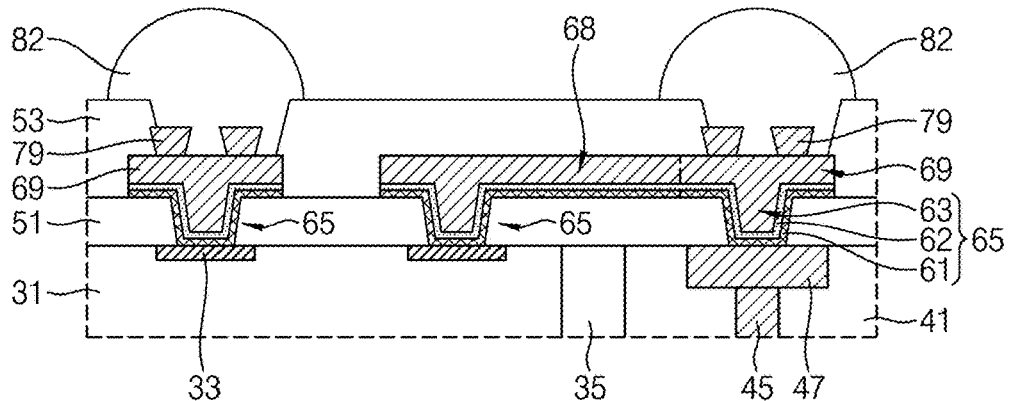

Referring to FIGS. 12 and 13, the second insulation layer 53 may cover the horizontal wiring 68, cover the side surfaces of the plurality of primary pads 69, partially cover the top surfaces of the plurality of primary pads 69, partially cover the side surfaces of the plurality of secondary pads 79, and partially cover the edges of the plurality of secondary pads 79. The plurality of solder balls 82 may pass through the second insulation layer 53 to partially contact the top surfaces and the side surfaces of the plurality of secondary pads 79 and the top surfaces of the plurality of primary pads 69.

Figure 14:
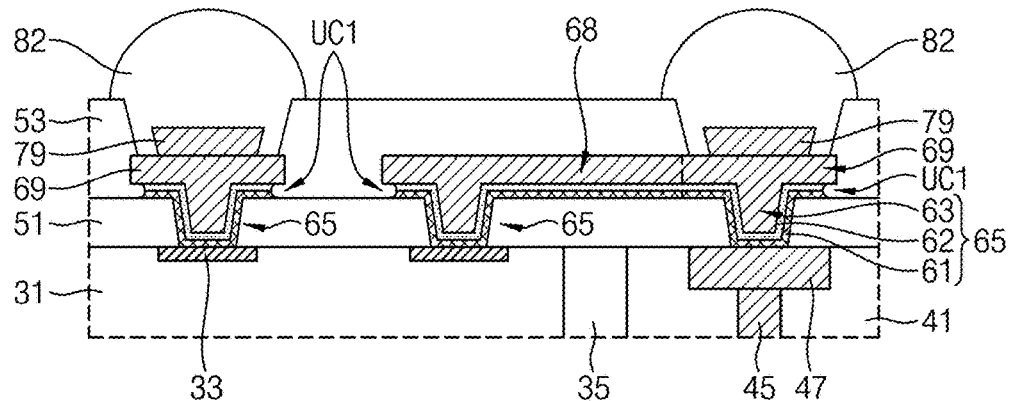

Referring to FIG. 14, a plurality of first undercut regions UC1 may be formed between the plurality of primary pads 69 and the first insulation layer 51 and between the horizontal wiring 68 and the first insulation layer 51. The second insulation layer 53 may extend to an inner portion of each of the plurality of first undercut regions UC1. The second insulation layer 53 may contact bottom surfaces of the plurality of primary pads 69 and bottom surfaces of the horizontal wiring 68. The second insulation layer 53 may contact side surfaces of the first barrier layer 61 and the first seed layer 62.

Figure 15:
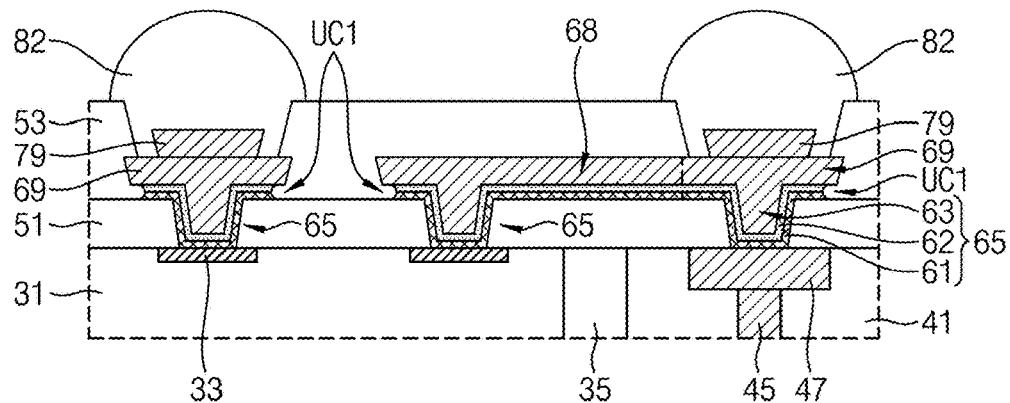

Referring to FIG. 15, the side surfaces of the plurality of primary pads 69 may have substantially the same profile as the side surface of the horizontal wiring 68. Each of the horizontal wiring 68 and the plurality of primary pads 69 may include an inverted trapezoidal shape where a horizontal width of an upper portion thereof is wider than that of a lower portion thereof. Each of the horizontal wiring 68 and the plurality of primary pads 69 may have a width which decreases toward the semiconductor chip 31 and/or the package substrate 41. Each of the horizontal wiring 68 and the plurality of primary pads 69 may have a width which increases toward one secondary pad 79 adjacent thereto among the plurality of secondary pads 79.

Figure 16:
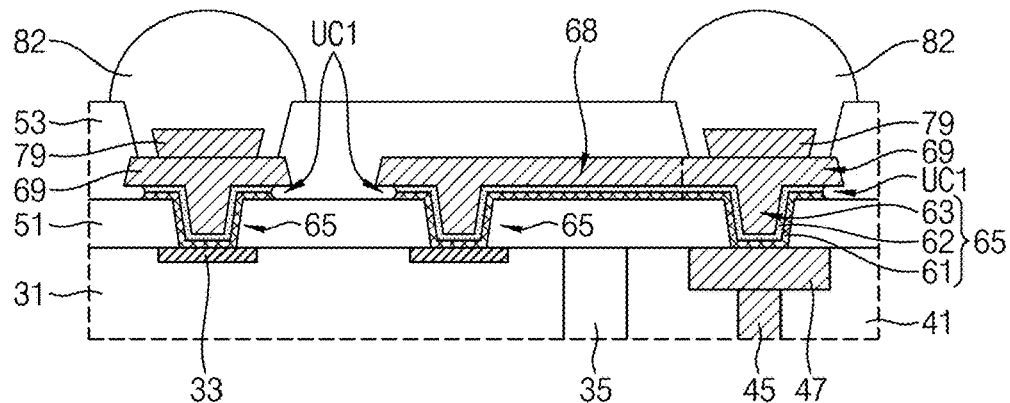

Referring to FIG. 16, the side surfaces of the plurality of primary pads 69 may have substantially the same profile as the side surface of the horizontal wiring 68. Each of the horizontal wiring 68 and the plurality of primary pads 69 may include a trapezoidal shape where a horizontal width of an upper portion thereof is narrower than that of a lower portion thereof. Each of the horizontal wiring 68 and the plurality of primary pads 69 may have a width which increases toward the semiconductor chip 31 or the package substrate 41. Each of the horizontal wiring 68 and the plurality of primary pads 69 may have a width which increases toward one secondary pad 79 adjacent thereto among the plurality of secondary pads 79.

Figure 17:
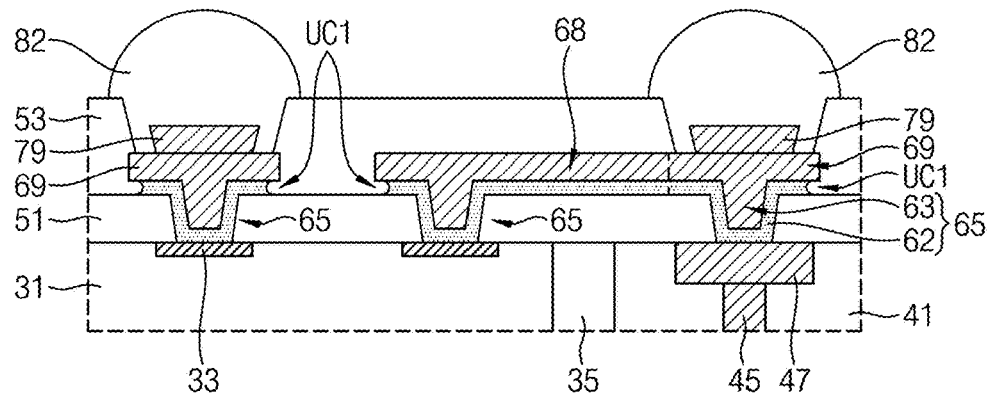

Referring to FIG. 17, a conductive core 63, a horizontal wiring 68, and a plurality of primary pads 69 may be on a first seed layer 62. As described above, the first barrier layer (61 of FIG. 2) may be omitted.

Figure 18:
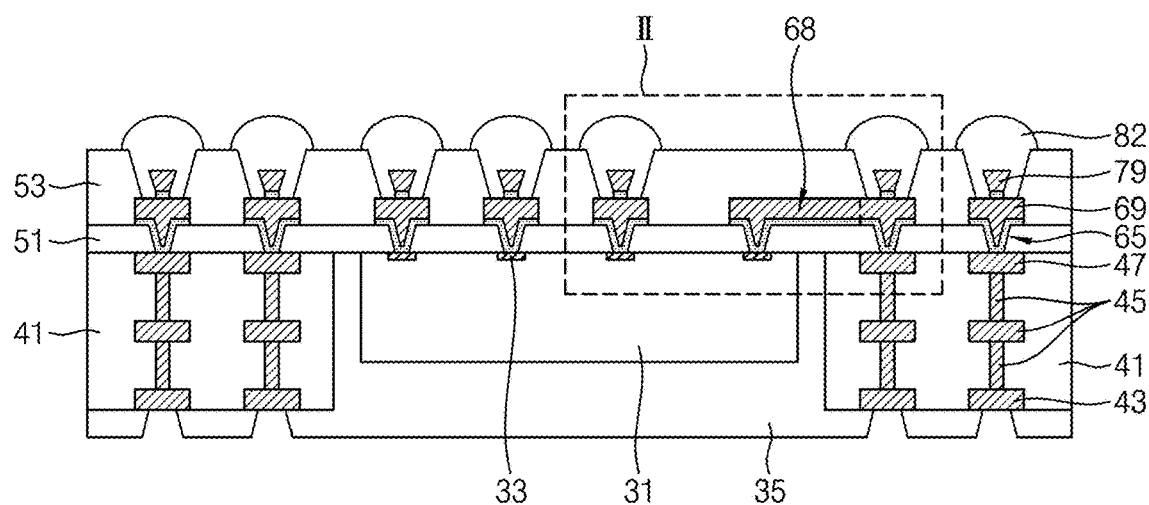
FIG. 18 is a cross-sectional view for describing a semiconductor device according to some example embodiments.
Figure 19:
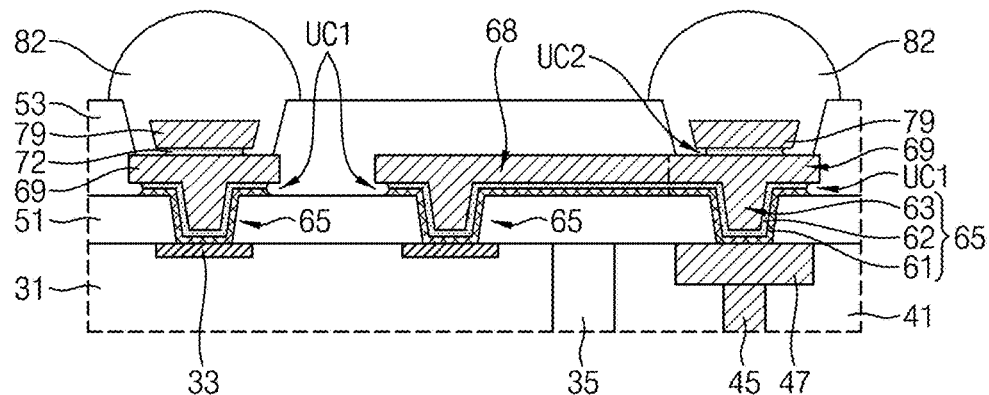
FIG. 19 is an enlarged view illustrating a portion of FIG. 18.

FIG. 18 is a cross-sectional view for describing semiconductor devices according to some example embodiments, and FIG. 19 is an enlarged view illustrating a portion II of FIG. 18.

Referring to FIGS. 18 and 19, a second seed layer 72 may be between a plurality of primary pads 69 and a plurality of secondary pads 79. A plurality of second undercut regions UC2 may be disposed between the plurality of primary pads 69 and the plurality of secondary pads 79. A plurality of solder balls 82 may extend to inner portions of the plurality of second undercut regions UC2. The plurality of solder balls 82 may contact bottom surfaces of the plurality of secondary pads 79 and side surfaces of the second seed layer 72.

Figure 20:
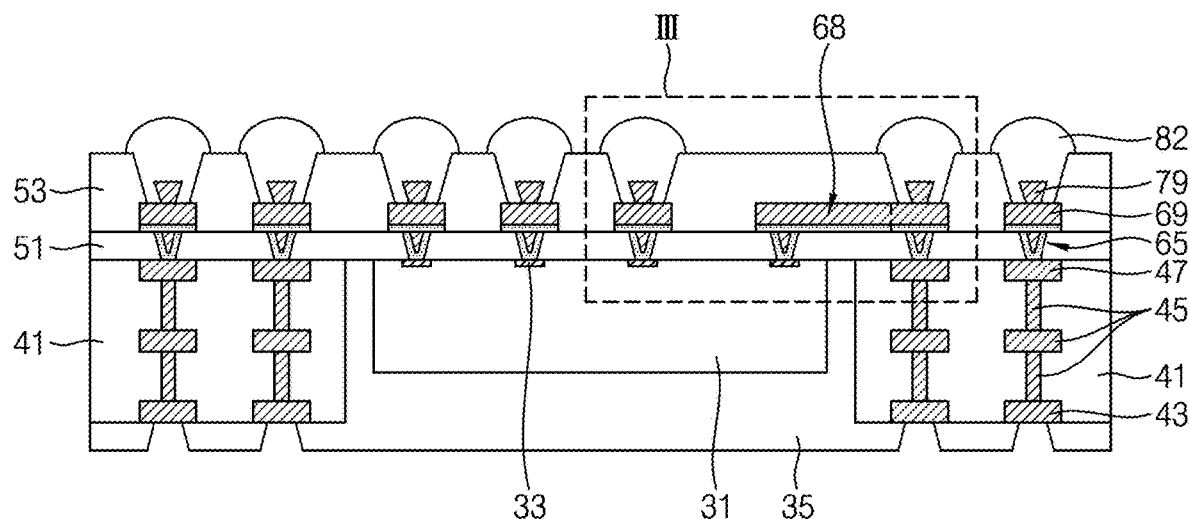
FIG. 20 is a cross-sectional view for describing a semiconductor device according to some example embodiments.
Figure 21:
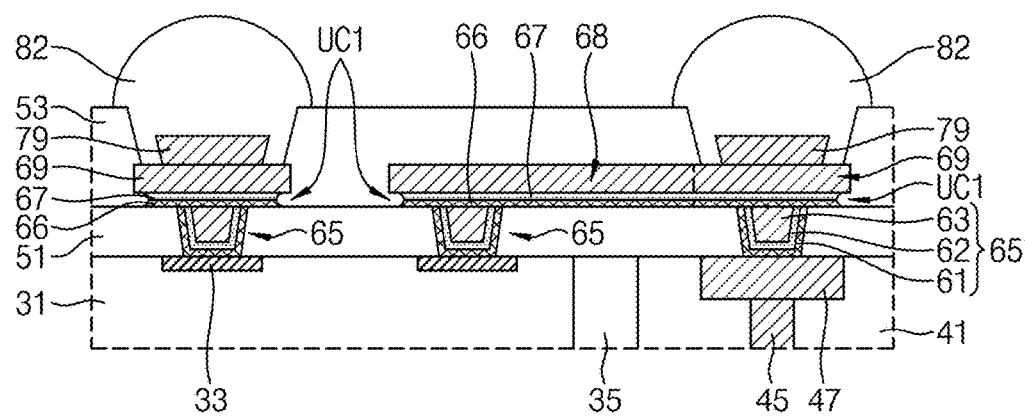
FIG. 21 is an enlarged view illustrating a portion of FIG. 20.

FIG. 20 is a cross-sectional view for describing semiconductor devices according to some example embodiments, and FIG. 21 is an enlarged view illustrating a portion III of FIG. 20.

Referring to FIGS. 20 and 21, each of a plurality of contact plugs 65 may include a first barrier layer 61, a first seed layer 62, and a conductive core 63. Top surfaces of the first insulation layer 51 and the plurality of contact plugs 65 may be substantially coplanar. The horizontal wiring 68 and the plurality of primary pads 69 may be on the first insulation layer 51 and the plurality of contact plugs 65. A second barrier layer 66 and a third seed layer 67 may be disposed between the horizontal wiring 68 and the first insulation layer 51 and between the plurality of primary pads 69 and the first insulation layer 51. The third seed layer 67 may be between the horizontal wiring 68 and the second barrier layer 66 and between the plurality of primary pads 69 and the second barrier layer 66.

Figure 22:
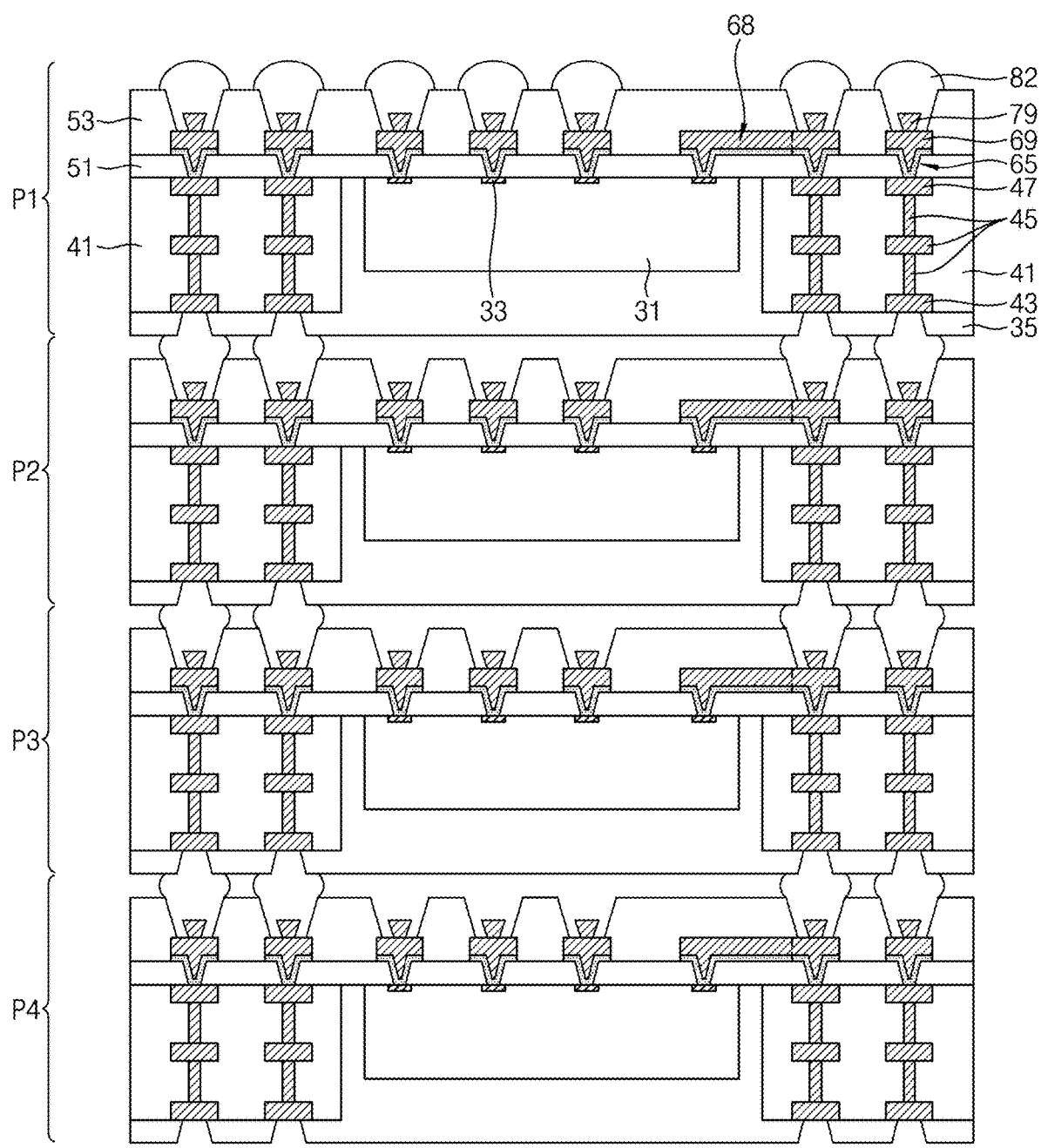
FIG. 22 is a cross-sectional view for describing a semiconductor device according to some example embodiments.

FIG. 22 is a cross-sectional view for describing semiconductor devices according to some example embodiments. The semiconductor devices according to an example embodiment may include a package on package (POP).

Referring to FIG. 22, the semiconductor devices may include a plurality of semiconductor packages P1 to P4 which are sequentially stacked. The plurality of semiconductor packages P1 to P4 may include a first semiconductor package P1, a second semiconductor package P2, a third semiconductor package P3, and a fourth semiconductor package P4. Each of the plurality of semiconductor packages P1 to P4 may include elements similar to the elements described above with reference to FIGS. 1 to 21. For example, the first semiconductor package P1 may include a semiconductor chip 31, an encapsulant 35, a package substrate 41, a first insulation layer 51, a second insulation layer 53, a plurality of contact plugs 65, a horizontal wiring 68, a plurality of primary pads 69, a plurality of secondary pads 79, and a plurality of solder balls 82. The semiconductor chip 31 may include a plurality of chip pads 33. The package substrate 41 may include a plurality of internal wirings 45, a plurality of bottom connection terminals 43, and a plurality of top connection terminals 47.

FIGS. 23 to 30 are cross-sectional views for describing methods of manufacturing semiconductor devices, according to an example embodiment.

Figure 23:
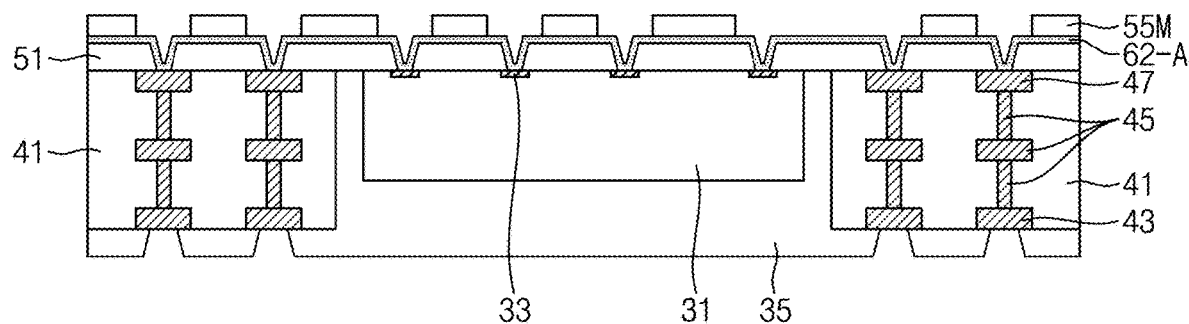
FIGS. 23 to 35 are cross-sectional views for describing some example methods of manufacturing a semiconductor device, according to an example embodiment.

Referring to FIG. 23, a semiconductor chip 31 may be attached on an inner portion of a package substrate 41 by using an encapsulant 35. The encapsulant 35 may surround a bottom surface and side surfaces of the semiconductor chip 31. The encapsulant 35 may extend to a portion between the package substrate 41 and the semiconductor chip 31.

The semiconductor chip 31 may include an application processor (AP), a microprocessor, a controller, a volatile memory, a non-volatile memory, or a combination thereof. The semiconductor chip 31 may include a plurality of chip pads 33. For example, the plurality of chip pads 33 may be formed adjacent to a top surface of the semiconductor chip 31. The plurality of chip pads 33 may include a conductive material, for example, metal, metal nitride, metal silicide, metal oxide, conductive carbon, or a combination thereof.

The package substrate 41 may include a plurality of internal wirings 45, a plurality of bottom connection terminals 43, and a plurality of top connection terminals 47. The plurality of internal wirings 45 may include a plurality of internal horizontal wirings and a plurality of internal contact plugs. The plurality of top connection terminals 47 may be electrically connected to the plurality of bottom connection terminals 43 via the plurality of internal wirings 45, respectively. The package substrate 41 may include an insulator material, like a plastic (e.g., polyester, polyimide, or the like), and may, for example, include a rigid printed circuit board, a flexible printed circuit board, a rigid-flexible printed circuit board, or a combination thereof. Each of the plurality of internal wirings 45, the plurality of bottom connection terminals 43, and the plurality of top connection terminals 47 may include a conductive material like metal, metal nitride, metal silicide, metal oxide, conductive carbon, or a combination thereof. For example, the plurality of top connection terminals 47 may include Cu.

The encapsulant 35 may include resin such as epoxy resin, thermoplastic resin such as polyimide, or resin where a reinforcing agent such as an inorganic filler is added thereto. The resin may be a thermocurable resin and/or a photosensitive resin. For example, the encapsulant 35 may include Ajinomoto build-up film (ABF), FR-4, bismaleimide triazine (BT) resin, or a combination thereof. In an embodiment, the encapsulant 35 may include an epoxy molding compound (EMC), underfill, a non-conductive film (NCF), a non-conductive paste (NCP), a photosensitive material, or a combination thereof. The encapsulant 35 may extend to a bottom surface of the package substrate 41. An edge of each of the plurality of bottom connection terminals 43 may be covered by the encapsulant 35. A center portion of each of the plurality of bottom connection terminals 43 may be exposed.

The first insulation layer 51 may be formed on the package substrate 41, the encapsulant 35, and the semiconductor chip 31. The first insulation layer 51 may cover the semiconductor chip 31. The first insulation layer 51 may include an insulative material, for example, silicon oxide, silicon nitride, silicon oxynitride, low-K dielectrics, high-K dielectrics, or a combination thereof. For example, the first insulation layer 51 may include photosensitive polyimide (PSPI). The first insulation layer 51 may include ABF.

A first seed layer 62-A may be formed on the first insulation layer 51. The first seed layer 62-A may cover the first insulation layer 51, may extend an inner portion of the first insulation layer 51, and may be connected to the plurality of top connection terminals 47 and the plurality of chip pads 33. The first seed layer 62-A may include a metal layer (for example a Cu layer) which is formed by using a chemical vapor deposition (CVD) process or a physical vapor deposition (PVD) process.

In an embodiment, before forming the first seed layer 62-A, a first barrier layer (61 of FIG. 2) may be formed on the first insulation layer 51. The first barrier layer (61 of FIG. 2) may include titanium (Ti), titanium nitride (TiN), tantalum (Ta), tantalum nitride (TaN), or a combination thereof. The first barrier layer (61 of FIG. 2) may be formed between the first seed layer 62-A and the first insulation layer 51, between the first seed layer 62-A and the plurality of top connection terminals 47, and between the first seed layer 62 and the plurality of chip pads 33. The first barrier layer may mitigate or prevent the migration of atoms from the seed layer to the first insulation layer 51.

A first mask pattern 55M may be formed on the first seed layer 62-A. The first mask pattern 55M may include, for example, a dry film (DF). A process of forming the first mask pattern 55M may include an exposure process and a development process.

Figure 24:
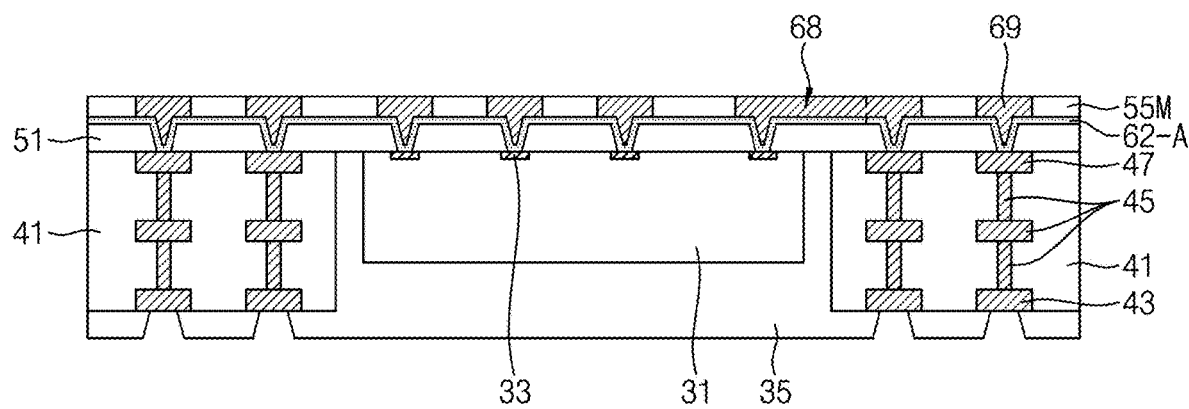

Referring to FIG. 24, a horizontal wiring 68 and a plurality of primary pads 69 may be formed on the first seed layer 62-A by using an electroplating process. The conductive core (63 of FIG. 2) may be formed in the middle of forming the horizontal wiring 68 and the plurality of primary pads 69. The horizontal wiring 68, the plurality of primary pads 69 and the conductive core (63 of FIG. 2) may include a metal layer, for example, a Cu layer. The first seed layer 62-A may act as an electrode in the electroplating process, reducing metal containing ions to form a coherent metal coating on the exposed portions of the first seed layer 62-A.

Figure 25:
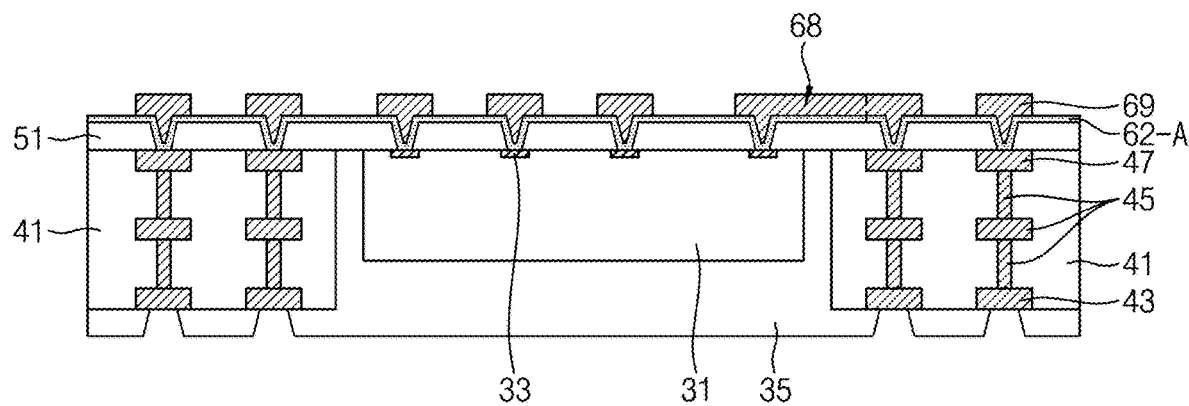

Referring to FIG. 25, the first seed layer 62-A may be exposed by removing the first mask pattern 55M.

Figure 26:
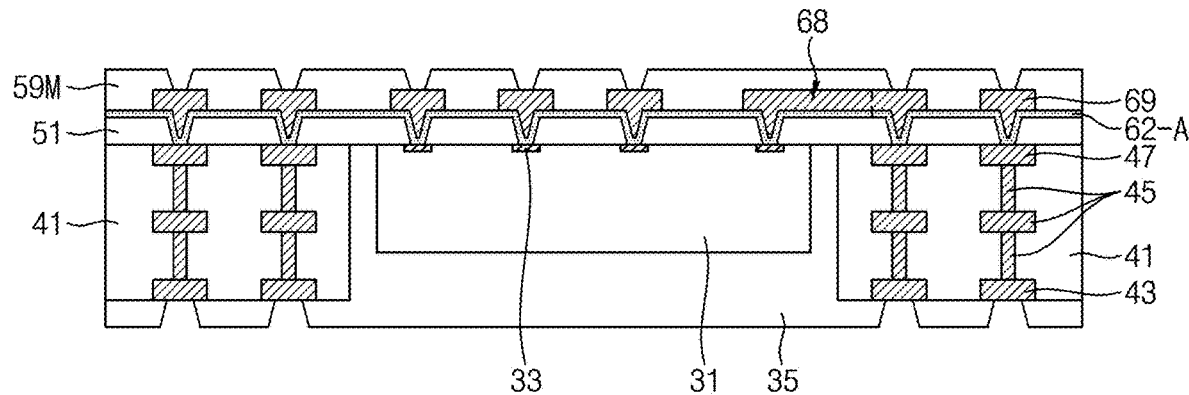

Referring to FIG. 26, a second mask pattern 59M covering the first seed layer 62-A and the horizontal wiring 68 may be formed. The second mask pattern may be formed on the exposed first seed layer 62-A and/or formed on first mask pattern 55M. The second mask pattern 59M may cover an edge of each of the plurality of primary pads 69. The second mask pattern 59M may partially cover the plurality of primary pads 69. A top surface of each of the plurality of primary pads 69 may be partially exposed. The second mask pattern 59M may include a DF. A process of forming the second mask pattern 59M may include an exposure process and a development process.

Figure 27:
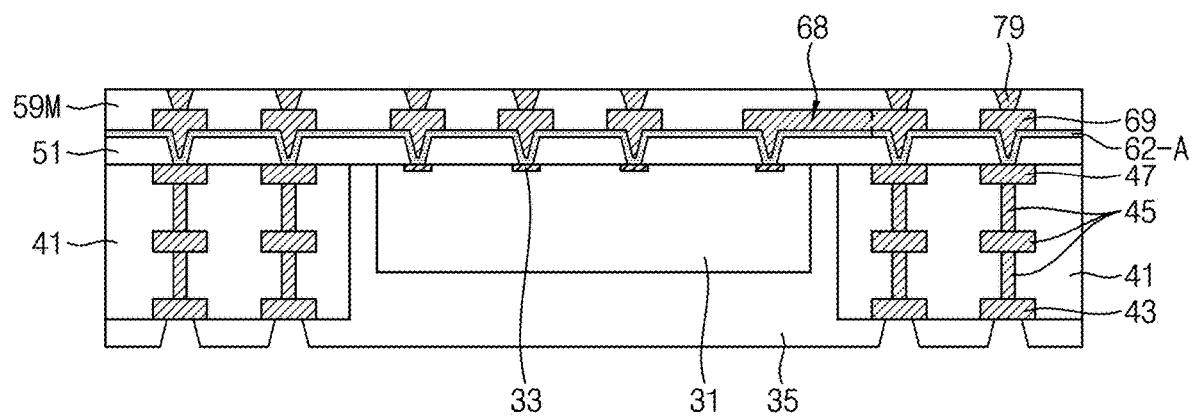

Referring to FIG. 27, a plurality of secondary pads 79 may be formed on the plurality of primary pads 69 by using an electroplating process. The plurality of secondary pads 79 may include a metal layer, for example, a Cu layer. Each of the plurality of secondary pads 79 may include the shapes described above, for example, a bar shape, a ring shape, a plurality of pillar shapes, a plurality of embossing shapes, an amoebic shape, the like, or a combination thereof.

Figure 28:
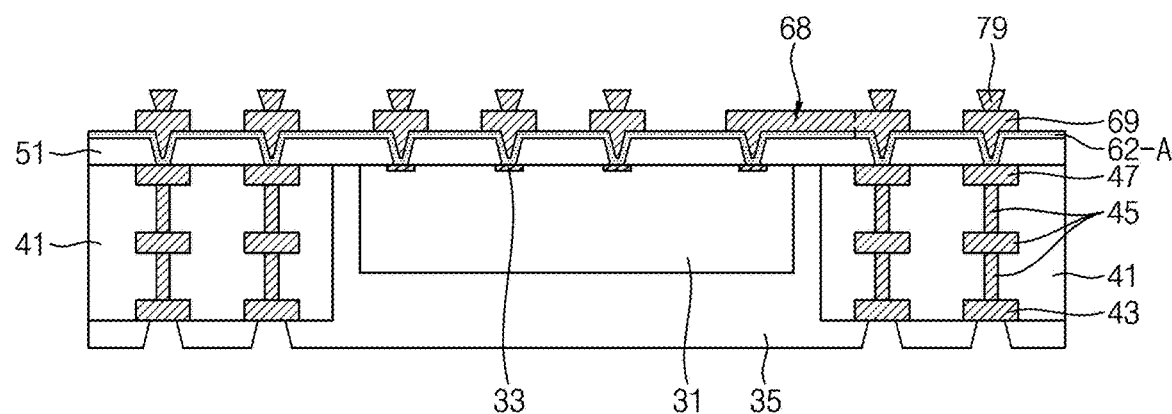

Referring to FIG. 28, the first seed layer 62-A may be exposed by removing the second mask pattern 59M.

Figure 29:
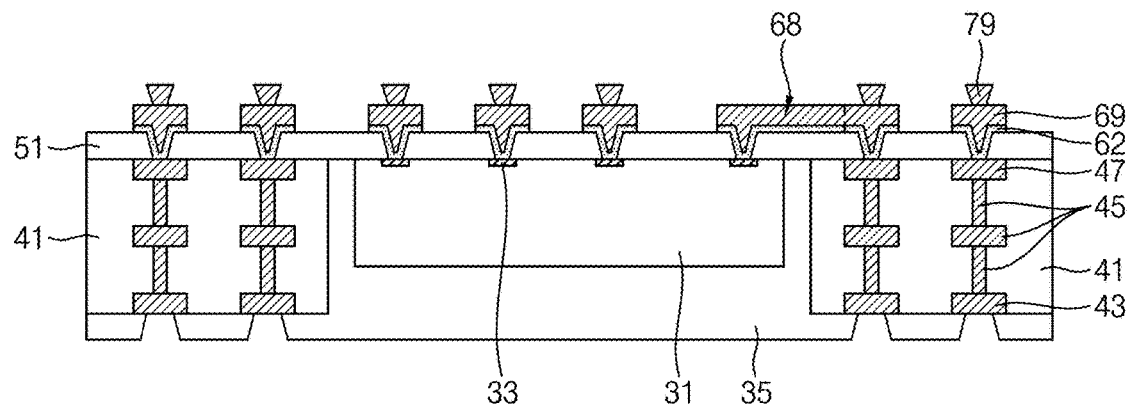

Referring to FIG. 29, by partially removing the first seed layer 62-A, the first seed layer 62 may be formed. The first seed layer 62 may remain between the plurality of primary pads 69 and the first insulation layer 51 and between the horizontal wiring 68 and the first insulation layer 51.

Figure 30:
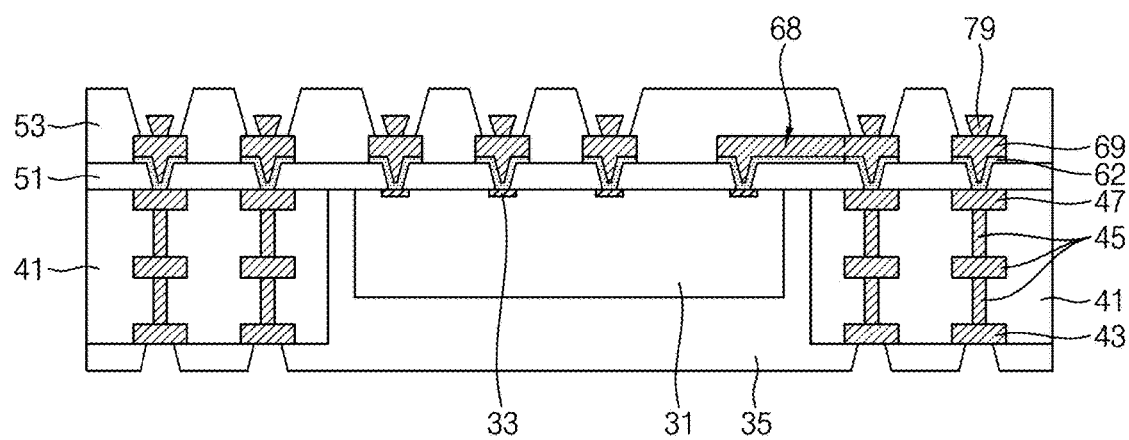

Referring to FIG. 30, a second insulation layer 53 may be formed on the first insulation layer 51. The second insulation layer 53 may cover the horizontal wiring 68, cover side surfaces of the plurality of primary pads 69, and an edge of a top surface of each of the plurality of primary pads 69. The second insulation layer 53 may include an insulative material, for example, silicon oxide, silicon nitride, silicon oxynitride, low-K dielectrics, high-K dielectrics, or a combination thereof. For example, the second insulation layer 53 may include PSPI. The second insulation layer 53 may include ABF.

Referring again to FIG. 1, a plurality of solder balls 82 may be formed on the plurality of primary pads 69 and the plurality of secondary pads 79. The plurality of solder balls 82 may include an SAC solder.

FIGS. 31 to 35 are cross-sectional views for describing methods of manufacturing semiconductor devices, according to some example embodiments. Hereinafter, only a difference with other embodiments will be briefly described.

Figure 31:
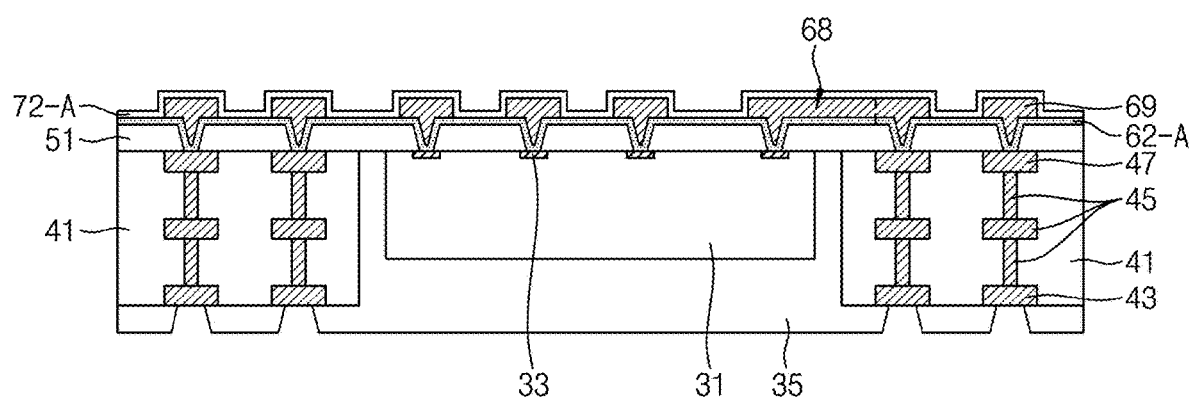

Referring to FIG. 31, after the first seed layer 62-A is exposed by removing the first mask pattern 55M (refer to FIG. 25) a second seed layer 72-A may be formed on the first seed layer 62, the horizontal wiring 68, and the plurality of primary pads 69. The second seed layer 72-A may include a metal layer (e.g., a Cu layer) which is formed by using a CVD process and/or a PVD process.

Figure 32:
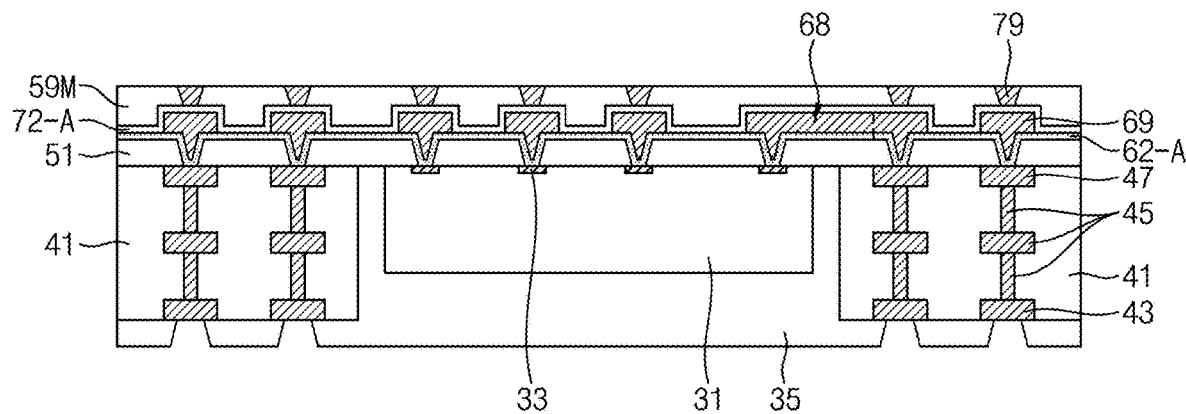

Referring to FIG. 32, a second mask pattern 59M may be formed on the second seed layer 72. A plurality of secondary pads 79 may be formed on the second seed layer 72 by using an electroplating process. The plurality of secondary pads 79 may be aligned on the plurality of primary pads 69.

Figure 33:
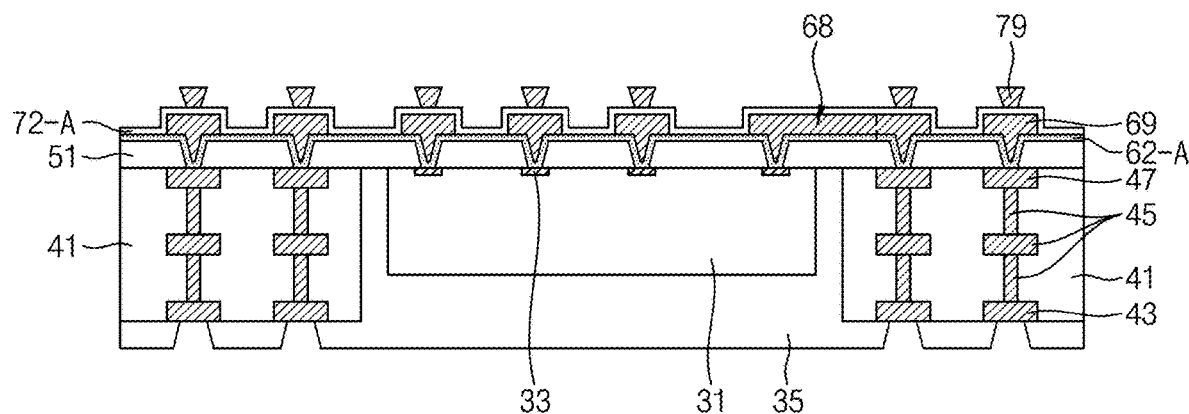

Referring to FIG. 33, the second mask pattern 59M may be removed.

Figure 34:
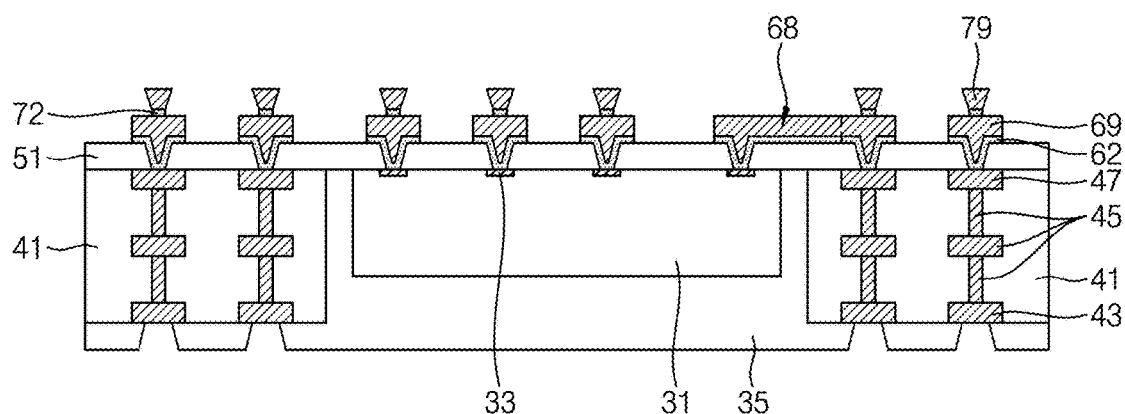

Referring to FIG. 34, the first seed layer 62-A and the second seed layer 72-A may be partially removed.

Figure 35:
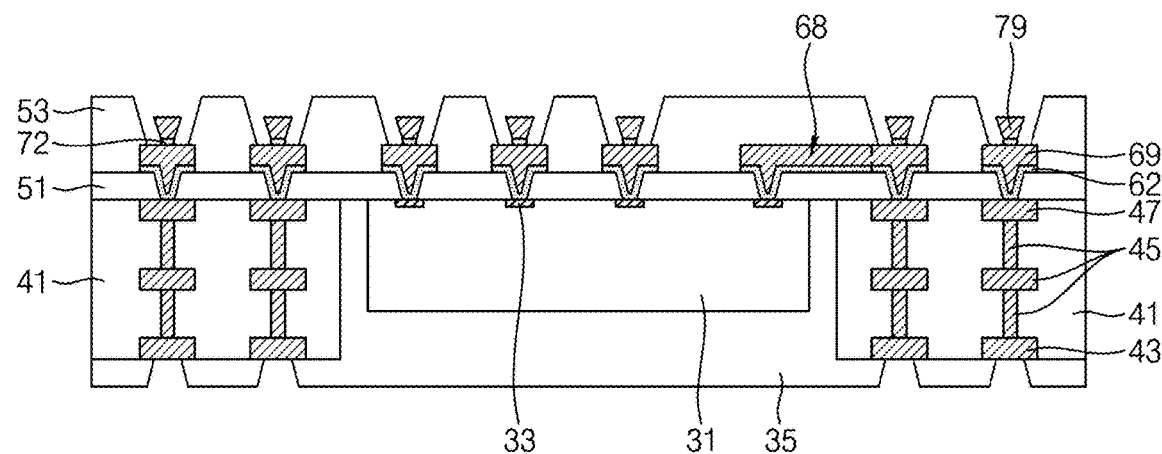

Referring to FIG. 35, a second insulation layer 53 may be formed and a plurality of solder balls 82 may be formed on the second insulation layer.

Figure 36:
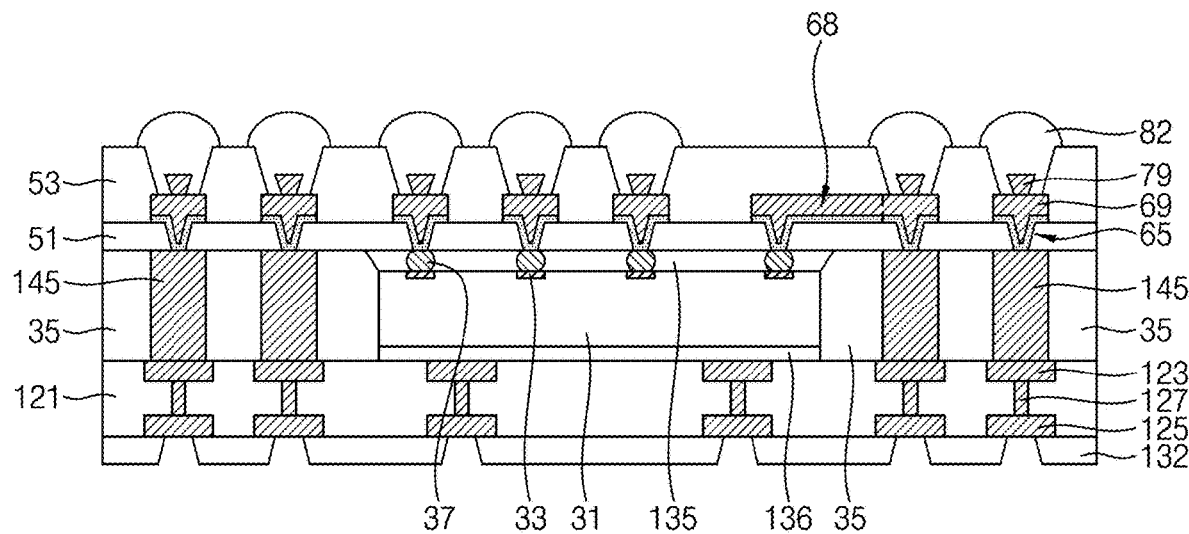
FIG. 36 is a cross-sectional view for describing some example semiconductor devices according to an example embodiment.

FIG. 36 is a cross-sectional view for describing semiconductor devices according to an embodiment. The semiconductor devices according to some example embodiments may include a WLP.

Referring to FIG. 36, the semiconductor devices according to an example embodiment may include a semiconductor chip 31, an encapsulant 35, a plurality of chip connection terminals 37, a first insulation layer 51, a second insulation layer 53, a plurality of contact plugs 65, a horizontal wiring 68, a plurality of primary pads 69, a plurality of secondary pads 79, a plurality of solder balls 82, a substrate 121, a rear insulation layer 132, an internal encapsulant 135, an adhesive 136, and a plurality of through electrodes 145. The semiconductor chip 31 may include a plurality of chip pads 33. The substrate 121 may include a plurality of top connection terminals 123, a plurality of bottom connection terminals 125, and a plurality of internal wirings 127. Hereinafter, only the differences will be briefly described.

The semiconductor chip 31 may be disposed on the substrate 121. The adhesive 136 may be disposed between the substrate 121 and the semiconductor chip 31. The substrate 121 may include an insulator material, like a plastic (e.g., polyester, polyimide, or the like), and may, for example, include a rigid printed circuit board, a flexible printed circuit board, a rigid-flexible printed circuit board, or a combination thereof. The substrate 121 may include an RDL. The adhesive 136 may include a die attach film (DAF), underfill, an NCF, an NCP, or a combination thereof.

Each of the plurality of top connection terminals 123, the plurality of bottom connection terminals 125, and the plurality of internal wirings 127 may include a conductive material, for example, metal, metal nitride, metal silicide, metal oxide, conductive carbon, or a combination thereof. The rear insulation layer 132 may cover a bottom surface of the substrate 121. The rear insulation layer 132 may cover edges of the plurality of bottom connection terminals 125 and may expose a center portion of each of the plurality of bottom connection terminals 125. The plurality of top connection terminals 123 may be electrically connected to the plurality of bottom connection terminals 125 via the plurality of internal wirings 127, respectively.

The encapsulant 35 may be disposed on the substrate 121. The encapsulant 35 may surround side surfaces of the semiconductor chip 31. The plurality of through electrodes 145 may be disposed in the encapsulant 35. The plurality of through electrodes 145 may pass through the encapsulant 35 and may be connected to the plurality of top connection terminals 123. The plurality of through electrodes 145 may directly contact the plurality of top connection terminals 123. The plurality of through electrodes 145 may include a metallic post (e.g., a copper power), a conductive bump, a bonding wire, or a combination thereof.

The internal encapsulant 135 may be disposed on the semiconductor chip 31. The internal encapsulant 135 may include an EMC, underfill, an NCF, an NCP, a photosensitive material, or a combination thereof. In an embodiment, the internal encapsulant 135 may include thermocurable and/or photosensitive resin such as epoxy resin, thermoplastic resin such as polyimide, or resin where a reinforcing agent such as an inorganic filler is added thereto. For example, the internal encapsulant 135 may include ABF, FR-4, BT resin, or a combination thereof.

The plurality of chip connection terminals 37 may be formed on the plurality of chip pads 33. The plurality of chip connection terminals 37 may pass through the internal encapsulant 135 and may contact the plurality of primary pads to the plurality of chip pads 33.

The plurality of chip connection terminals 37 may be electrically connected to the semiconductor chip 31 via the plurality of chip pads 33. The plurality of chip connection terminals 37 may include a conductive material, for example, metal, metal nitride, metal silicide, metal oxide, conductive carbon, or a combination thereof. For example, the plurality of chip connection terminals 37 may include a solder bump. The internal encapsulant 135 may be disposed between the semiconductor chip 31 and the first insulation layer 51. Top surfaces of the encapsulant 35, the plurality of through electrodes 145, the internal encapsulant 135, and the plurality of chip connection terminals 37 may be substantially coplanar.

The first insulation layer 51 may be on the encapsulant 35, the plurality of through electrodes 145, the internal encapsulant 135, and the plurality of chip connection terminals 37. The plurality of contact plugs 65 may be in the first insulation layer 51. The horizontal wiring 68 and the plurality of primary pads 69 may be on the first insulation layer 51.

According to the example embodiments, a primary pad may be disposed on a seed layer. A secondary pad may be disposed on the primary pad. A solder ball may be disposed on the primary pad and the secondary pad. The solder ball may contact a top surface and a side surface of the secondary pad and may contact a top surface of the primary pad. A contact area between the solder ball and the secondary pad and a contact area between the solder ball and the primary pad may be increased or maximized. A semiconductor device having improved electrical characteristic and/or higher reliability may be implemented through a simplified process.

The aforementioned semiconductor devices with a semiconductor chip in an encapsulant, a primary pad, and a secondary pad, according to some example embodiments, may be applied to various electronic devices including a bus and/or redistribution layer, for example as part of and/or connecting processing circuitry and/or memory.

Figure 37:
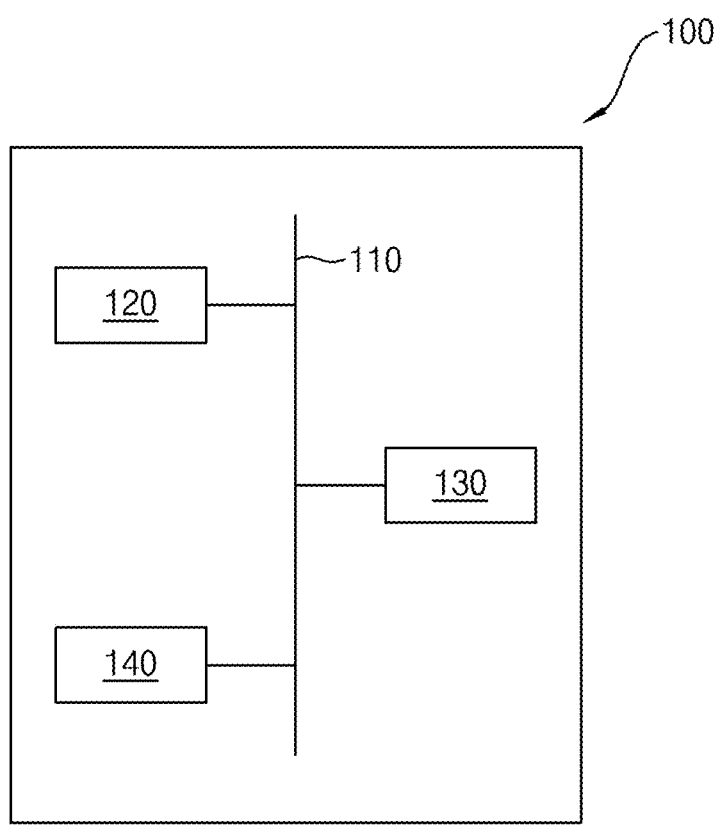
FIG. 37 shows a schematic of an electronic device that may include the aforementioned semiconductor devices according to some example embodiments.

FIG. 37 shows a schematic of an electronic device that may include the aforementioned semiconductor devices according to some example embodiments.

As shown, the electronic device 100 includes one or more electronic device components, including a processor (e.g., processing circuitry) 120 and a memory 130 that are communicatively coupled together via a bus 110.

The processing circuitry 120, may be included in, may include, and/or may be implemented by one or more instances of processing circuitry such as hardware including logic circuits, a hardware/software combination such as a processor executing software; or a combination thereof. For example, the processing circuitry 120 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 130 may include a non-transitory computer readable storage device, for example a solid state drive (SSD), storing a program of instructions, and the processing circuitry 120 may be configured to execute the program of instructions to implement the functionality of the electronic device 100.

In some example embodiments, the electronic device 100 may include one or more additional components 140, coupled to bus 110, which may include, for example, a power supply, a light sensor, a light-emitting device, any combination thereof, or the like. In some example embodiments, one or more of the processing circuitry 120, memory 130, and/or one or more additional components 140 may include any semiconductor devices with a semiconductor chip, a primary pad, and a secondary pad according to any of the example embodiments described herein, such that the one or more of the processing circuitry 120, memory 130, and/or one or more additional components 140, and thus, the electronic device 100, may include the semiconductor chip 31 (refer to FIG. 1).

While the example embodiments have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A semiconductor device comprising:
   a semiconductor chip in an encapsulant;
   a first insulation layer on the encapsulant and the semiconductor chip;
   a horizontal wiring and a primary pad on the first insulation layer, a thickness of the primary pad substantially the same as a thickness of the horizontal wiring;
   a secondary pad on an upper surface of the primary pad;
   a second insulation layer on the first insulation layer, the second insulation layer covering the horizontal wiring; and
   a solder ball on the primary pad and the secondary pad,
   wherein an uppermost surface of the second insulation layer is farther from an upper surface of the first insulation layer than a top surface of the secondary pad, and
   the upper surface of the primary pad is above a lowermost surface of the second insulating layer.

2. The semiconductor device of claim 1, wherein a width at an upper surface the secondary pad is greater than a width at a lower surface of the secondary pad.

3. The semiconductor device of claim 1, wherein the secondary pad has a width which is narrower than a width of the primary pad.

4. The semiconductor device of claim 1, wherein the secondary pad comprises the same material as a material of the primary pad.

5. The semiconductor device of claim 1, wherein the secondary pad and the primary pad comprise a copper (Cu) layer.

6. The semiconductor device of claim 1, wherein the secondary pad comprises at least one of a bar shape, a ring shape, a plurality of pillar shapes, a plurality of embossing shapes, an amoebic shape.

7. The semiconductor device of claim 1, wherein the primary pad comprises the same material layer as the horizontal wiring.

8. The semiconductor device of claim 1, wherein a side surface of the primary pad has substantially the same profile as a profile of a side surface of the horizontal wiring when viewed in a cross-section view.

9. The semiconductor device of claim 1, wherein a width at the upper surface of the primary pad is greater than a width at a lower surface of the primary pad.

10. The semiconductor device of claim 1, wherein
    the second insulation layer covers an edge of the primary pad, and
    the solder ball extends to an inner portion of the second insulation layer, contacts a top surface of the primary pad, and contacts a top surface and a side surface of the secondary pad.

11. The semiconductor device of claim 1, further comprising:
    a first seed layer,
    wherein the primary pad is between the first seed layer and the secondary pad.

12. The semiconductor device of claim 11, further comprising:
    a first undercut region between the primary pad and the first insulation layer,
    wherein the second insulation layer extends to an inner portion of the first undercut region and contacts a bottom surface of the primary pad and a side surface of the first seed layer.

13. The semiconductor device of claim 11, further comprising:
    a second seed layer between the primary pad and the secondary pad.

14. The semiconductor device of claim 13, further comprising:
    a second undercut region between the secondary pad and the primary pad,
    wherein the solder ball extends to an inner portion of the second undercut region and contacts a bottom surface of the secondary pad and a side surface of the second seed layer.

15. The semiconductor device of claim 1, further comprising:
    a chip pad in the semiconductor chip,
    a contact plug in an inner portion of the first insulation layer, the contact plug electrically connected to the chip pad, and
    the horizontal wiring is disposed on the contact plug.

16. The semiconductor device of claim 1, further comprising:
    a chip pad in the semiconductor chip; and
    a contact plug in an inner portion of the first insulation layer, the contact plug electrically connected to the chip pad,
    wherein the primary pad is on the contact plug.

17. A semiconductor device comprising:
    a semiconductor chip in a package substrate;
    a first insulation layer on the package substrate and the semiconductor chip;
    a horizontal wiring and a primary pad on the first insulation layer, a thickness of the primary pad substantially the same as a thickness of the horizontal wiring;

a secondary pad on the primary pad;
a second insulation layer covering the horizontal wiring on the first insulation layer; and
a solder ball on the primary pad and the secondary pad
wherein an uppermost surface of the second insulation layer is farther from an upper surface of the first insulation layer than a top surface of the secondary pad, and
the upper surface of the primary pad is above a lowermost surface of the second insulating layer.

18. The semiconductor device of claim 17, further comprising an encapsulant between the package substrate and the semiconductor chip.

19. The semiconductor device of claim 17, further comprising:
a bottom connection terminal, a top connection terminal, and an internal wiring between the bottom connection terminal and the top connection terminal in the package substrate; and
a contact plug in an inner portion of the first insulation layer, the contact plug electrically connected to the top connection terminal to extend to,
wherein the primary pad is disposed on the contact plug.

20. A semiconductor device comprising:
a stack of semiconductor packages, the stack including a plurality of semiconductor packages, wherein each of the plurality of semiconductor packages includes
a semiconductor chip in a package substrate;
a first insulation layer on the package substrate and the semiconductor chip;
a horizontal wiring and a primary pad on the first insulation layer, a thickness of the primary pad substantially the same as a thickness of the horizontal wiring;
a secondary pad on the primary pad;
a second insulation layer covering the horizontal wiring on the first insulation layer; and
a solder ball on the primary pad and the secondary pad,
wherein an uppermost surface of the second insulation layer is farther from an upper surface of the first insulation layer than a top surface of the secondary pad, and
the upper surface of the primary pad is above a lowermost surface of the second insulating layer.

* * * * *